(12) United States Patent
Lin

(10) Patent No.: US 8,305,508 B2
(45) Date of Patent: *Nov. 6, 2012

(54) PIXEL STRUCTURE AND METHOD FOR FABRICATING THE SAME

(75) Inventor: Hsiang-Lin Lin, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 461 days.

This patent is subject to a terminal disclaimer.

(21) Appl. No.: 12/507,935

(22) Filed: Jul. 23, 2009

(65) Prior Publication Data

US 2010/0193827 A1 Aug. 5, 2010

(30) Foreign Application Priority Data

Feb. 2, 2009 (TW) .............................. 98103286 A

(51) Int. Cl.
*G02F 1/136* (2006.01)
(52) U.S. Cl. .......................................... 349/43; 349/42

(58) Field of Classification Search .............. 349/41–43; 257/59, 72

See application file for complete search history.

(56) References Cited

U.S. PATENT DOCUMENTS 6,738,109 B2 5/2004 Jeon
7,808,567 B2 * 10/2010 Lin et al. ......................... 349/42

* cited by examiner

*Primary Examiner* — Dung T. Nguyen
(74) *Attorney, Agent, or Firm* — McClure, Qualey & Rodack, LLP

(57) ABSTRACT

A pixel structure includes a first patterned metal layer, a gate insulating layer, a semiconductor channel layer, a second patterned metal layer, a passivation layer, and a conducting layer. A gate line of the second patterned metal layer is electrically connected by the conducting layer to a gate extension electrode of the first patterned metal layer. A source electrode of the second patterned metal layer is electrically connected by the conducting layer to a second data line segment of the first patterned metal layer. A method for fabricating a pixel structure is also disclosed herein.

10 Claims, 10 Drawing Sheets

PIXEL STRUCTURE AND METHOD FOR FABRICATING THE SAME

RELATED APPLICATIONS

This application claims priority to Taiwan Patent Application Serial Number 98103286, filed Feb. 2, 2009, which is herein incorporated by reference.

BACKGROUND

1. Field of Invention

The present invention relates to a liquid crystal display structure and a method for fabricating the same. More particularly, the present invention relates to a pixel structure in a liquid crystal display and a method for fabricating the same.

2. Description of Related Art

For a liquid crystal display, an aperture ratio of a pixel therein directly affects the utilization efficiency of a backlight source and also affects the display brightness of the display. The key factor which determines the aperture ratio of the pixel is the distance between the pixel electrode and the data line. However, when the pixel electrode is too close to the data line, the parasitic capacitance therebetween would increase, thus causing that charges on the pixel electrode would be affected due to different voltage signals transmitted from the data lines before the next frame comes and further generating cross talk effects.

A prior art is provided to add a layer of common electrode between the pixel electrode and the data line, such that the effects generated by the parasitic capacitance (Cpd) are shielded by the common electrode. Nevertheless, using the foregoing method to fabricate the pixel not only needs several insulating layers but also needs an additional metal layer as the common electrode for shielding. As a result, steps of the fabrication process and the complexity increase, and time and costs of the fabrication process increase as well.

SUMMARY

In accordance with one embodiment of the present invention, a method for fabricating a pixel structure is provided. The method includes the steps of: forming a first patterned metal layer on a substrate, the first patterned metal layer comprising a gate electrode, a gate extension electrode, a first data line segment and a second data line segment connected with the first data line segment; forming a gate insulating layer on the substrate and the first patterned metal layer; forming a semiconductor channel layer on the gate insulating layer above the gate electrode; forming a second patterned metal layer on the gate insulating layer and the semiconductor channel layer, the second patterned metal layer comprising a source electrode, a drain electrode, a gate line and a common electrode, wherein the source electrode and the drain electrode are correspondingly formed on the semiconductor channel layer above two sides of the gate electrode, and the common electrode is disposed above the first data line segment; forming a passivation layer on the gate insulating layer and the second patterned metal layer; forming a plurality of first contact holes and a plurality of second contact holes at the same time, wherein the first contact holes separately expose a portion of the gate extension electrode and a portion of the second data line segment of the first patterned metal layer, and the second contact holes separately expose a portion of the gate line, a portion of the source electrode and a portion of the drain electrode of the second patterned metal layer; and forming a conducting layer covering the first contact holes and the second contact holes, such that the gate line of the second patterned metal layer is electrically connected by the conducting layer through the first contact hole and the second contact hole to the gate extension electrode of the first patterned metal layer, and the source electrode of the second patterned metal layer is electrically connected by the conducting layer through the first contact hole and the second contact hole to the second data line segment of the first patterned metal layer.

In accordance with another embodiment of the present invention, a pixel structure is provided. The pixel includes a first patterned metal layer, a gate insulating layer, a semiconductor channel layer, a second patterned metal layer, a passivation layer, and a conducting layer. The first patterned metal layer is disposed on a substrate and includes a gate electrode, a gate extension electrode, and a data line including a first data line segment and a second data line segment. The gate insulating layer is formed on the substrate and the first patterned metal layer. The semiconductor channel layer is disposed on the gate insulating layer above the gate electrode. The second patterned metal layer is disposed on the gate insulating layer and the semiconductor channel layer and includes a source electrode, a drain electrode, a gate line and a common electrode, wherein the source electrode and the drain electrode are correspondingly disposed on the semiconductor channel layer above two sides of the gate electrode, and the common electrode is disposed above the first data line segment. The passivation layer is formed on the gate insulating layer and the second patterned metal layer. The passivation layer and the gate insulating layer uncovers a portion of the gate extension electrode and a portion of the second data line segment of the first patterned metal layer. The passivation layer uncovers a portion of the gate line, a portion of the source electrode and a portion of the drain electrode of the second patterned metal layer. The conducting layer covers the passivation layer. The gate line of the second patterned metal layer is electrically connected by the conducting layer to the gate extension electrode of the first patterned metal layer. The source electrode of the second patterned metal layer is electrically connected by the conducting layer to the second data line segment of the first patterned metal layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference to the accompanying drawings as follows.

DESCRIPTION OF THE EMBODIMENTS

In the following detailed description, the embodiments of the present invention have been shown and described. As will be realized, the invention is capable of modification in various respects, all without departing from the invention. Accordingly, the drawings and description are to be regarded as illustrative in nature, and not restrictive.

Figure 1A:
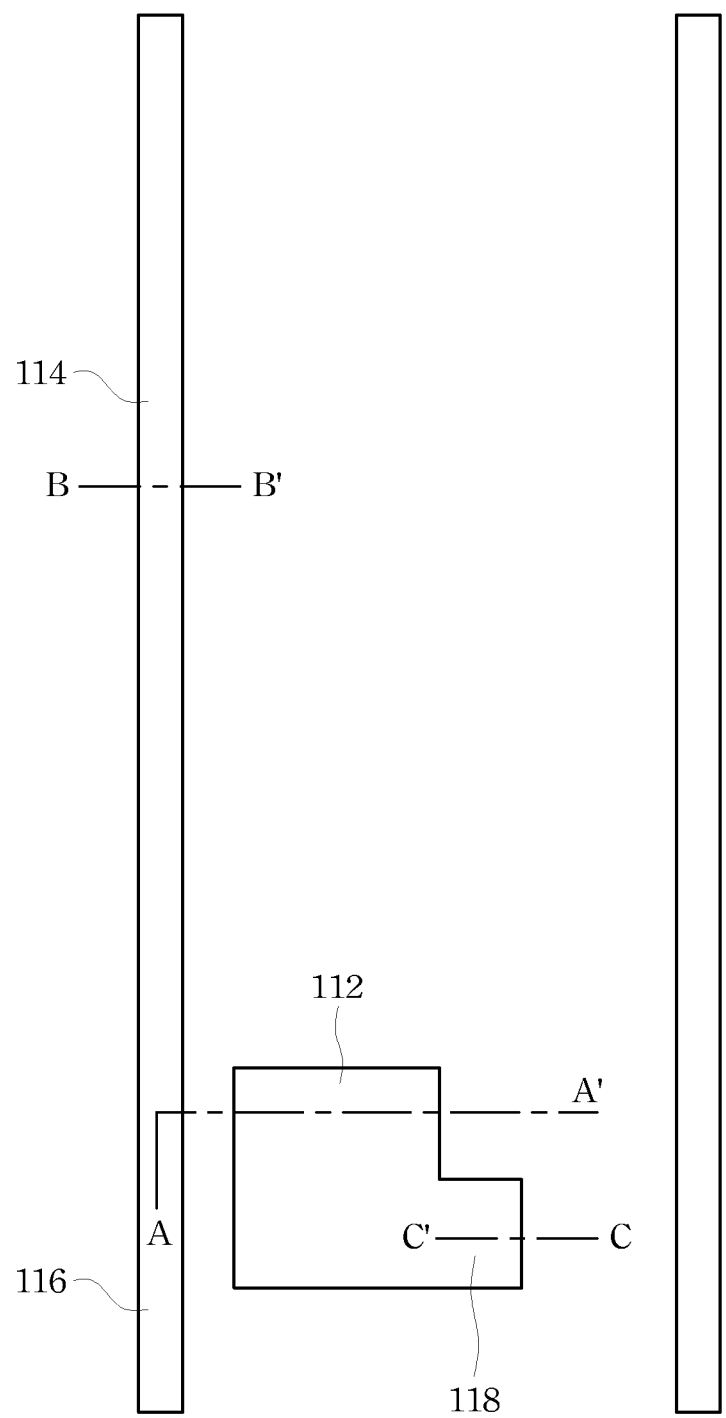
FIG. 1A through FIG. 1E illustrate top views of a fabrication process of a pixel structure according to one embodiment of the present invention.

FIG. 1A through FIG. 1E illustrate top views of a fabrication process of a pixel structure according to one embodiment of the present invention. FIG. 2A through FIG. 2E respectively illustrate cross-sectional views, along cross section lines AA', BB' and CC', of the pixel structure shown in FIG. 1A through FIG. 1E. First, as shown in FIG. 1A and FIG. 2A, a first patterned metal layer 110 is formed on a substrate 102, in which the first patterned metal layer 110 includes a gate electrode 112, a data line including a first data line segment 114 and a second data line segment 116, and a gate extension electrode 118. The first data line segment 114 and the second data line segment 116 separately represent different portions of the data line along the cross section lines AA' and BB'. For the fabrication material, the substrate 102 can be a glass substrate or a plastic substrate, and the first patterned metal layer 110 can be metal material such as aluminum, copper, silver, gold, etc. or a combination thereof.

Figure 1B:
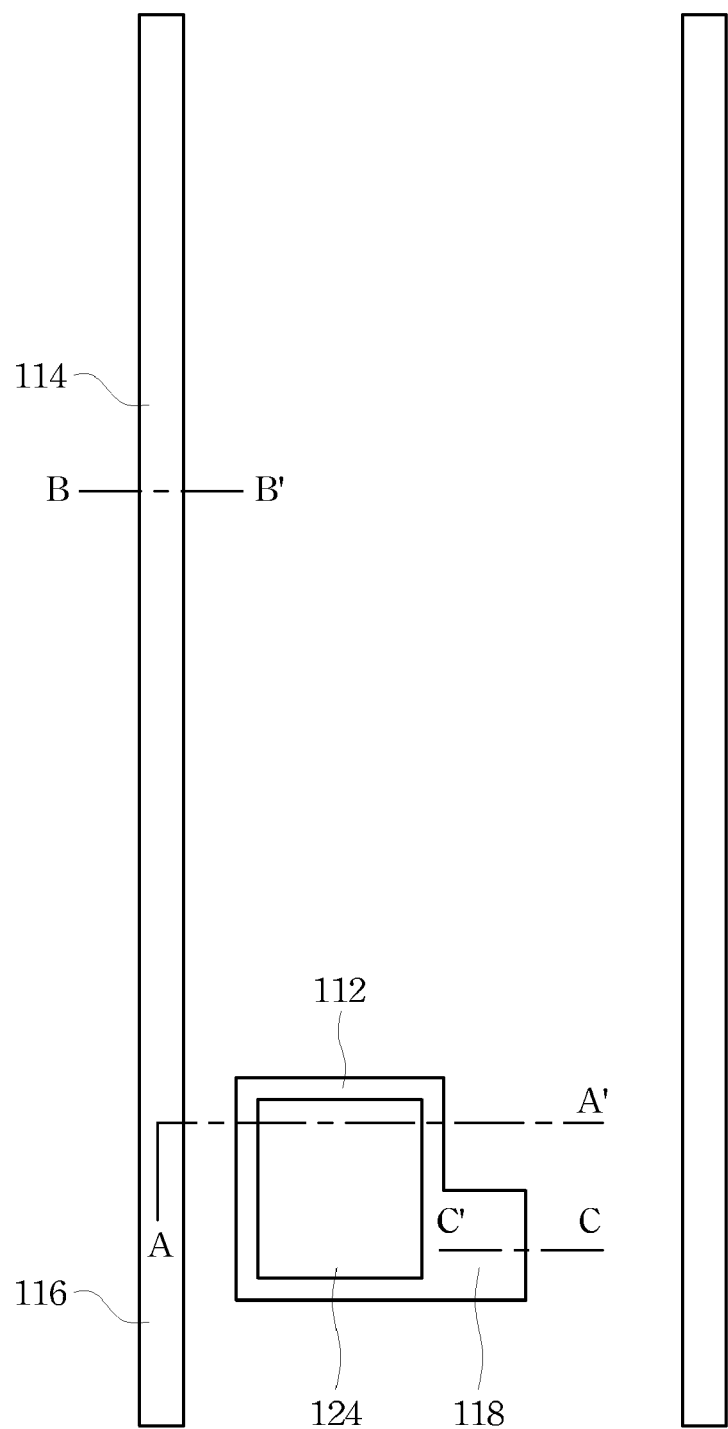
Figure 2A:
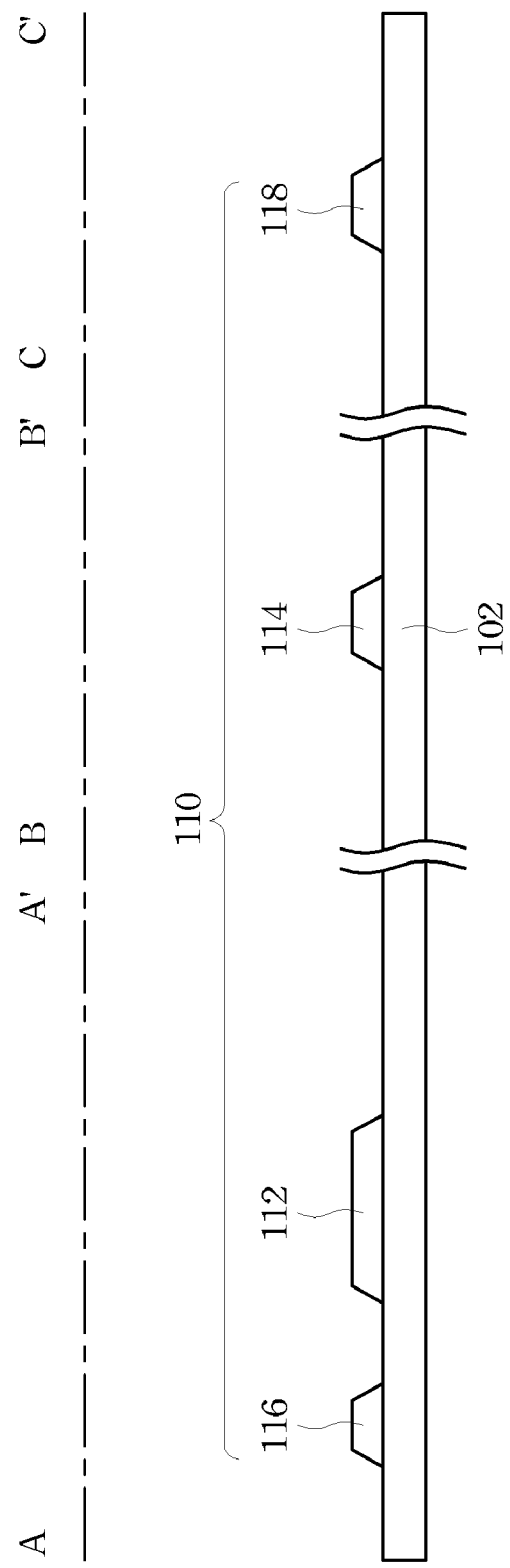
FIG. 2A through FIG. 2E respectively illustrate cross-sectional views, along cross section lines AA', BB' and CC', of the pixel structure shown in FIG. 1A through FIG. 1E.
Figure 2B:
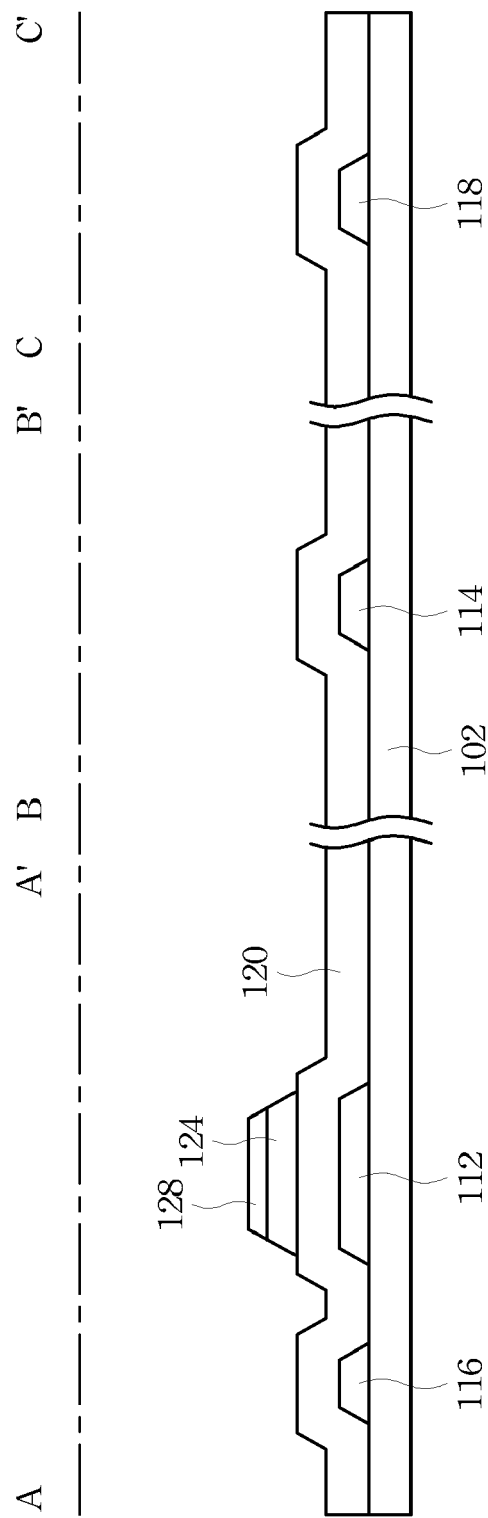

As shown in FIG. 1B and FIG. 2B, a gate insulating layer 120 is then formed on the substrate 102 and the first patterned metal layer 110 to cover the substrate 102 and the first patterned metal layer 110. Then, a patterned semiconductor channel layer 124 and a patterned doped semiconductor layer 128 (e.g. N-type doped semiconductor layer) thereon are formed on the gate insulating layer 120 above the gate electrode 112. The material of the gate insulating layer 120 can be dielectric material such as silicon dioxide ($SiO_2$), silicon nitride ($SiN_X$) or silicon oxynitride ($SiO_XN_Y$).

Figure 1C:
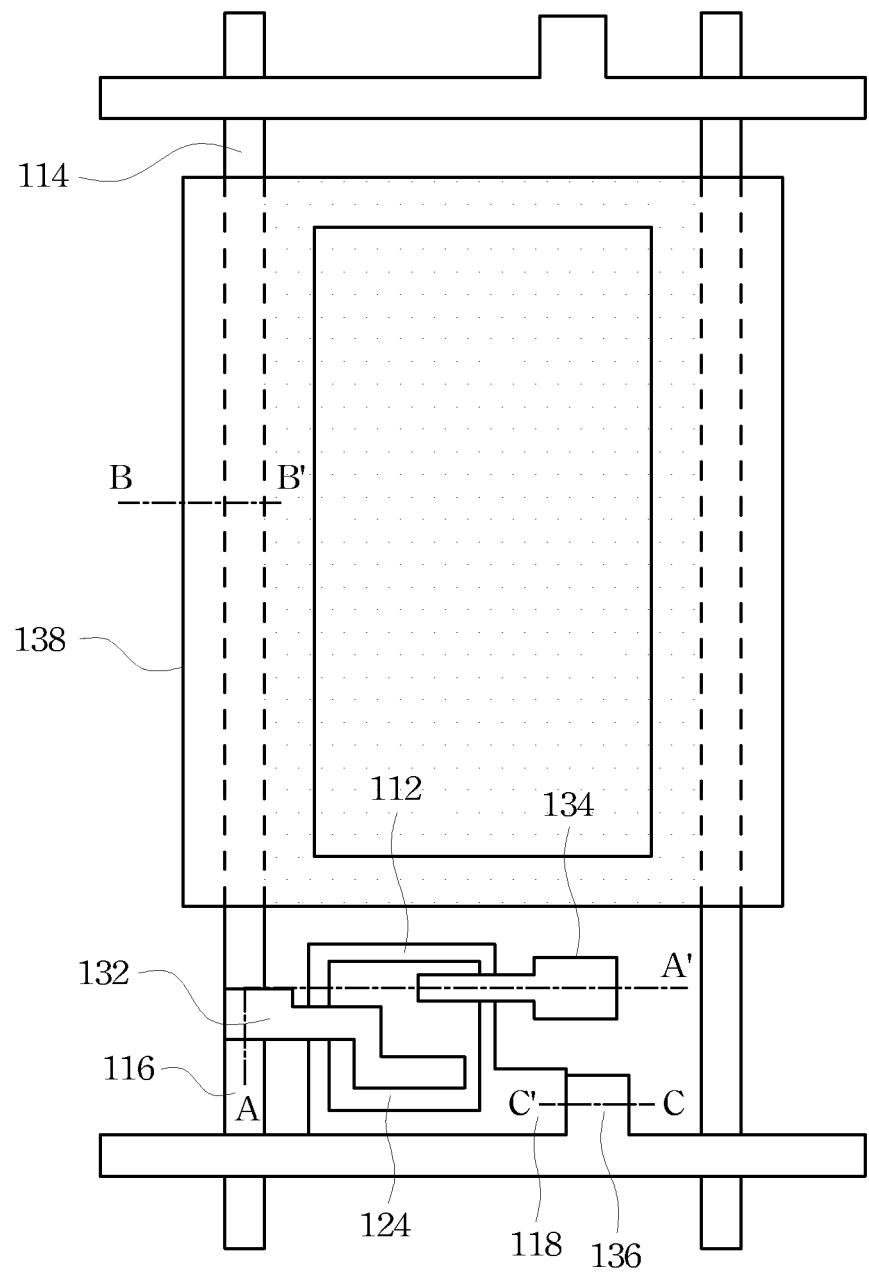
Figure 2C:
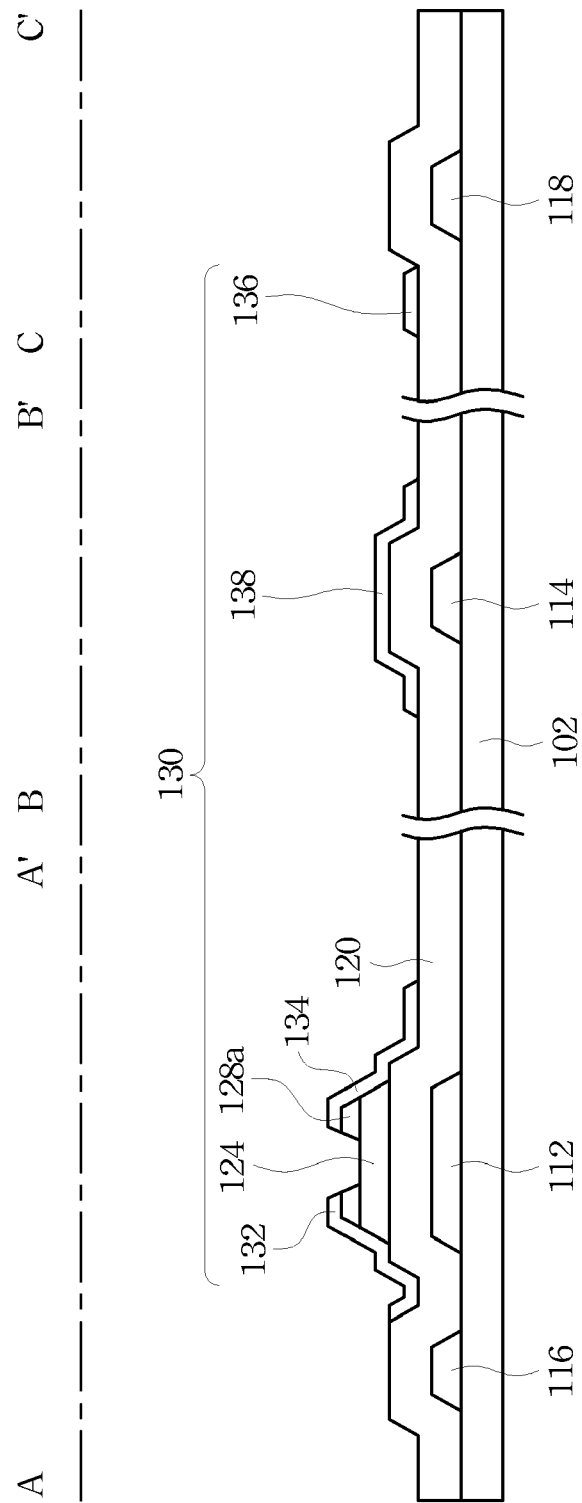

Moreover, as shown in FIG. 1C and FIG. 2C, a second patterned metal layer 130 is formed on the gate insulating layer 120, the semiconductor channel layer 124 and the patterned doped semiconductor layer 128, in which the second patterned metal layer 130 includes a source electrode 132, a drain electrode 134, a gate line 136 and a common electrode 138, and the second patterned metal layer 130 also can be metal material such as aluminum, copper, silver, gold, etc. or a combination thereof. During the process of forming the second patterned metal layer 130, a portion of the patterned doped semiconductor layer 128 would be removed to expose a portion of the semiconductor channel layer 124, thus forming an ohmic contact layer 128a. In addition, the source electrode 132 and the drain electrode 134 are correspondingly formed on the semiconductor channel layer 124 above two sides of the gate electrode 112, and the common electrode 138 is disposed above the first data line segment 114. Notably, the "source" electrode 132 and the "drain" electrode 134 can be switched to be named as the "drain" electrode and the "source" electrode based on a different design or naming in practice.

Figure 1D:
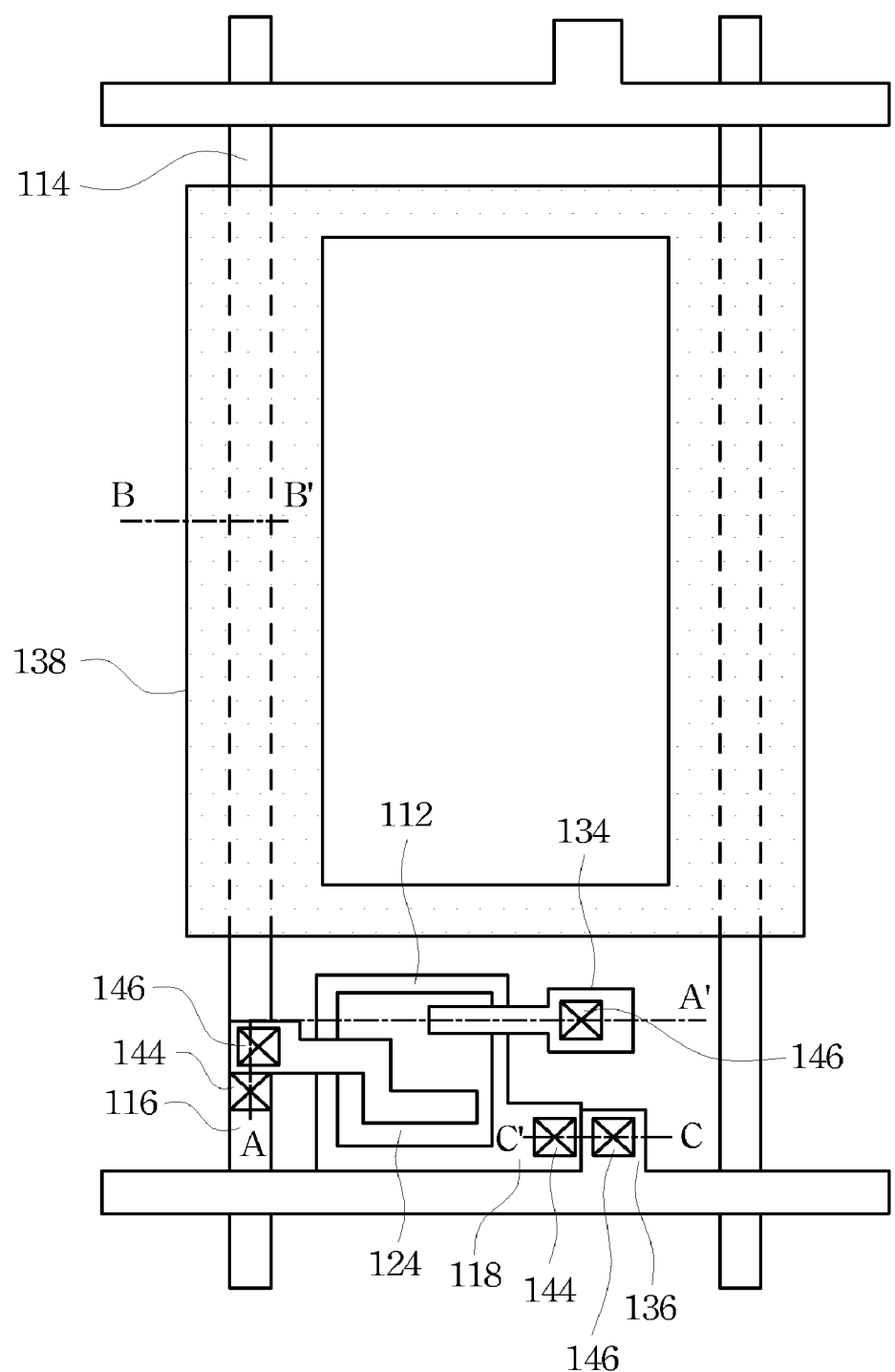
Figure 2D:
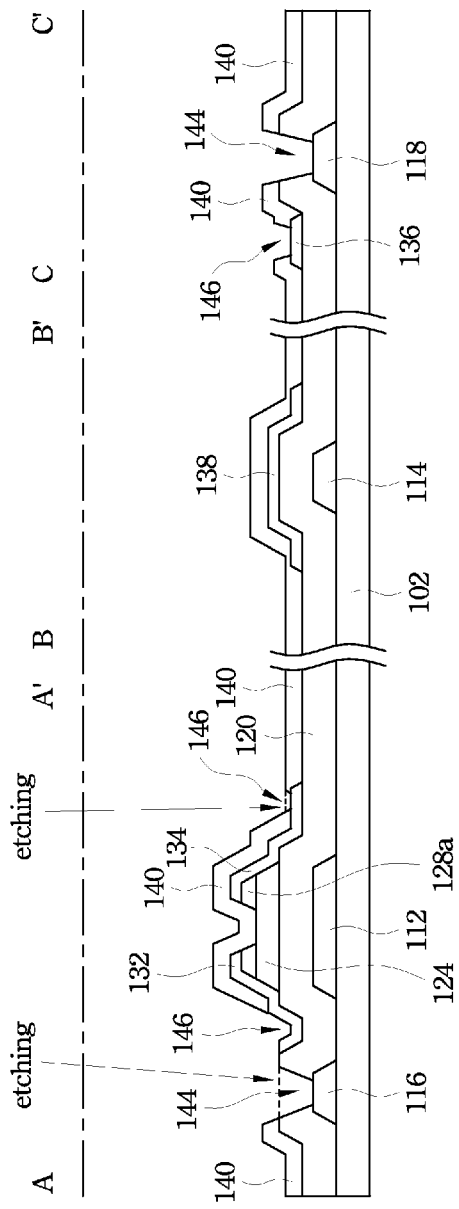

After that, as shown in FIG. 1D and FIG. 2D, a passivation layer 140 is formed on the foregoing fabricated structure to cover it. For example, the passivation layer 140 is formed to cover the gate insulating layer 120, the second patterned metal layer 130 and the expose portion of the semiconductor channel layer 124, in which the passivation layer 140 can be dielectric material such as silicon dioxide ($SiO_2$), silicon nitride ($SiN_X$) or silicon oxynitride ($SiO_XN_Y$). Then, a plurality of first contact holes 144 and a plurality of second contact holes 146 are formed at the same time on a portion of the first patterned metal layer 110 and a portion of the second patterned metal layer 130, in which the first contact holes 144 separately expose a portion of the gate extension electrode 118 and a portion of the second data line segment 116 of the first patterned metal layer, and the second contact holes 146 separately expose a portion of the gate line 136, a portion of the drain electrode 134 and a portion of the source electrode 132 of the second patterned metal layer 130.

Furthermore, the foregoing step of forming the first contact holes 144 and the second contact holes 146 at the same time can be completed by using a single photomask fabrication process, for example, a halftone mask and photolithography, and by etching the gate insulating layer 120 and the passivation layer 140 above the first patterned metal layer 130 to expose the corresponding portions. Specifically, in the step of forming the first contact holes 144, a portion of the gate insulating layer 120 and a portion of the passivation layer 140 above the gate extension electrode 118 can be removed to expose a portion of the gate extension electrode 118, and a portion of the gate insulating layer 120 and a portion of the passivation layer 140 above the second data line segment 116 can be removed to expose a portion of the second data line segment 116. On the other hand, in the step of forming the second contact holes 146, portions of the passivation layer 140 above the gate line 136, the source electrode 132 and the drain electrode 134 can be removed to expose portions of gate line 136, the source electrode 132 and the drain electrode 134.

Figure 1E:
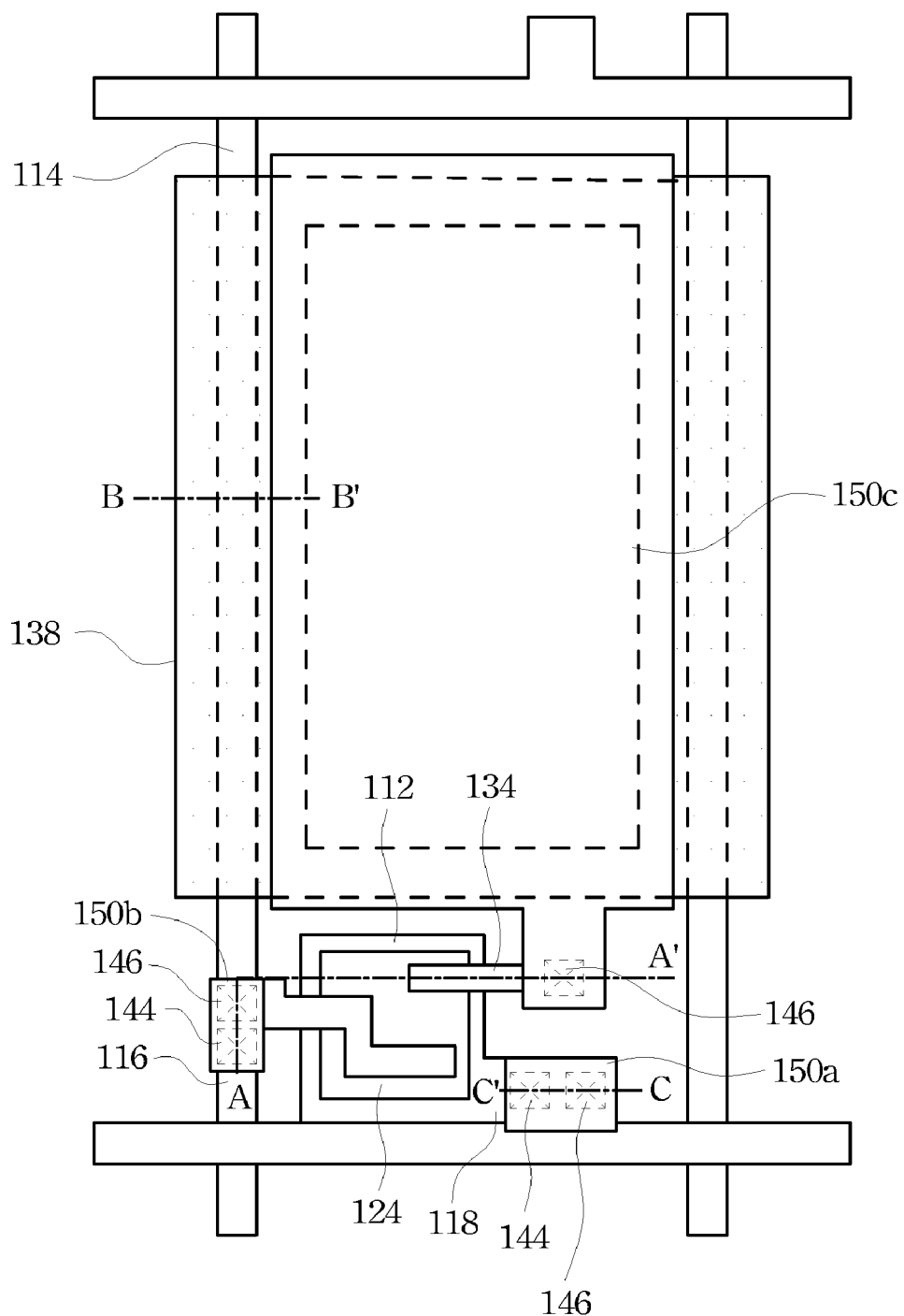
Figure 2E:
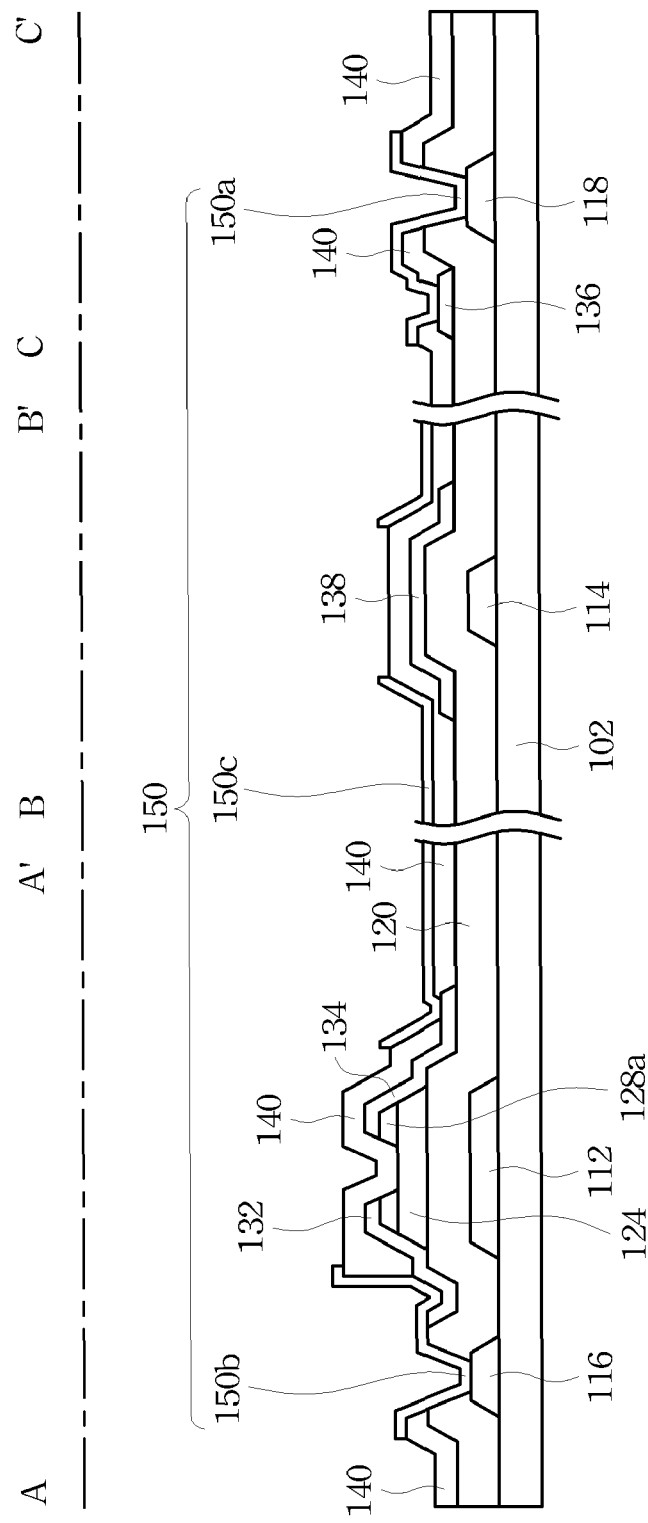

Afterwards, as shown in FIG. 1E and FIG. 2E, a conducting layer 150 is formed covering the foregoing first contact holes 144 and second contact holes 146, such that the gate line 136 of the second patterned metal layer 130 is electrically connected by the conducting layer 150 through the first contact hole 144 and the second contact hole 146 to the gate extension electrode 118 of the first patterned metal layer 110, and the source electrode 132 of the second patterned metal layer 130 is electrically connected by the conducting layer 150 through the first contact hole 144 and the second contact hole 146 to the second data line segment 116 of the first patterned metal layer 110. In one embodiment, the conducting layer 150 is a patterned transparent conducting layer, and its material can be transparent conducting material such as indium tin oxide (ITO) or indium zinc oxide (IZO). As a result, the fabrication process can be effectively simplified and the material necessary for the fabrication process can be reduced.

Therefore, the foregoing conducting layer 150 includes a gate line connecting electrode 150a, a data line connecting electrode 150b and a pixel electrode 150c, in which the gate line connecting electrode 150a electrically connects the gate line 136 to the gate extension electrode 118, the data line connecting electrode 150b electrically connects the source electrode 132 to the second data line segment 116, and the pixel electrode 150c covers the second contact hole 146 on the drain electrode 134 and is electrically connected to the drain electrode 134.

For the foregoing embodiments, the pixel and the method for fabricating the same can be employed to reduce the required steps and complexity of the fabrication process, thus reducing the time and costs.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded with the broadest interpretation so as to encompass all such modifications and similar structures.

What is claimed is:
1. A method for fabricating a pixel structure, comprising:
    forming a first patterned metal layer on a substrate, the first patterned metal layer comprising a gate electrode, a gate extension electrode, a first data line segment and a second data line segment connected with the first data line segment;
    forming a gate insulating layer on the substrate and the first patterned metal layer;

forming a semiconductor channel layer on the gate insulating layer above the gate electrode;

forming a second patterned metal layer on the gate insulating layer and the semiconductor channel layer, the second patterned metal layer comprising a source electrode, a drain electrode, a gate line and a common electrode, wherein the source electrode and the drain electrode are correspondingly formed on the semiconductor channel layer above two sides of the gate electrode, and the common electrode is disposed above the first data line segment;

forming a passivation layer on the gate insulating layer and the second patterned metal layer;

forming a plurality of first contact holes and a plurality of second contact holes at the same time, wherein the first contact holes separately expose a portion of the gate extension electrode and a portion of the second data line segment of the first patterned metal layer, and the second contact holes separately expose a portion of the gate line, a portion of the source electrode and a portion of the drain electrode of the second patterned metal layer; and forming a conducting layer covering the first contact holes and the second contact holes, such that the gate line of the second patterned metal layer is electrically connected by the conducting layer through the first contact hole and the second contact hole to the gate extension electrode of the first patterned metal layer, and the source electrode of the second patterned metal layer is electrically connected by the conducting layer through the first contact hole and the second contact hole to the second data line segment of the first patterned metal layer.

2. The method of claim 1, wherein the step of forming the first contact holes and the second contact holes at the same time further comprises:

etching the gate insulating layer and the passivation layer above the first patterned metal layer.

3. The method of claim 1, wherein the conducting layer is a patterned transparent conducting layer.

4. The method of claim 1, wherein the conducting layer comprises a gate line connecting electrode, and the gate line connecting electrode is electrically connected to the gate line and the gate extension electrode.

5. The method of claim 1, wherein the conducting layer comprises a data line connecting electrode, and the data line connecting electrode is electrically connected to the source electrode and the second data line segment.

6. The method of claim 1, wherein the step of forming the first contact holes and the second contact holes at the same time is completed using a single photomask fabrication process.

7. The method of claim 6, wherein the single photomask fabrication process utilizes a halftone mask.

8. The method of claim 1, wherein the step of forming the first contact holes to separately expose a portion of the gate extension electrode and a portion of the second data line segment of the first patterned metal layer comprises:

removing a portion of the gate insulating layer and a portion of the passivation layer above the gate extension electrode and removing a portion of the gate insulating layer and a portion of the passivation layer above the second data line segment.

9. The method of claim 1, wherein the step of forming the second contact holes to separately expose a portion of the gate line, a portion of the source electrode and a portion of the drain electrode of the second patterned metal layer comprises:

removing portions of the passivation layer above the gate line, the source electrode and the drain electrode.

10. The method of claim 1, wherein the conducting layer comprises a pixel electrode, and the pixel electrode covers the second contact hole on the drain electrode.

* * * * *